United States Patent
Wille et al.

[11] Patent Number: 5,804,881
[45] Date of Patent: Sep. 8, 1998

[54] METHOD AND ASSEMBLY FOR PROVIDING IMPROVED UNDERCHIP ENCAPSULATION

[75] Inventors: Steven Lewis Wille; Daniel Roman Gamota, both of Palatine, Ill.

[73] Assignee: Motorola, Inc., Schaumburg, Ill.

[21] Appl. No.: 562,861

[22] Filed: Nov. 27, 1995

[51] Int. Cl.$^6$ ............................ H01L 23/48; H01L 23/52; H01L 29/40
[52] U.S. Cl. ............................................ 257/780; 257/787
[58] Field of Search .................................. 257/779, 780, 257/781, 782, 783, 787, 738

[56] References Cited

U.S. PATENT DOCUMENTS

| | | |
|---|---|---|
| 4,604,644 | 8/1986 | Beckham et al. . |
| 5,120,678 | 6/1992 | Moore et al. . |
| 5,128,746 | 7/1992 | Pennisi et al. . |
| 5,218,534 | 6/1993 | Thompson et al. . |
| 5,239,178 | 8/1993 | Lin et al. .................................. 257/779 |
| 5,550,408 | 8/1996 | Kunitomo et al. . |
| 5,621,225 | 4/1997 | Shieh et al. ................................ 257/779 |
| 5,623,006 | 4/1997 | Papathomas ............................. 257/779 |
| 5,629,566 | 5/1997 | Doi et al. .................................. 257/779 |
| 5,641,996 | 6/1997 | Omoya et al. ............................ 257/780 |

*Primary Examiner*—Mahshid D. Saadat
*Assistant Examiner*—S. V. Clark
*Attorney, Agent, or Firm*—John B. MacIntyre; Douglas D. Fekete

[57] ABSTRACT

A microelectronic assembly (10) includes a printed circuit board (12) that includes a substrate (14) having a die attach region (22) and a plurality of first bond pads (24) disposed and spaced apart at the die attach region (22). A channel (26) effective in improving fluid flow extends across the die attach region (22) apart from the first bond pads (24). An integrated circuit die (16) is mounted onto the printed circuit board (12) and includes a major face (28) facing the substrate (14) and spaced apart therefrom by a gap (30) and second bond pads (25) disposed on the major face (28) in a pattern such that each of the second bond pads (25) registers with a first bond pad (24). Solder bump interconnections (18) connect the first bond pads (24) to the second bond pads (25). Encapsulant (20) is disposed within the gap (30) and flows over the substrate (14) and the channel (26) to encapsulate the solder bump interconnections (18). Channel 26 enhances the flow of the precursor (19) in the gap (30) prior to curing the precursor (19) to form the encapsulant (20).

7 Claims, 2 Drawing Sheets

METHOD AND ASSEMBLY FOR PROVIDING IMPROVED UNDERCHIP ENCAPSULATION

FIELD OF THE INVENTION

This invention relates generally to a microelectronic assembly in which an integrated circuit die is spaced apart from a printed circuit board by a gap that is filled with a polymer encapsulant. More particularly, this invention relates to such a microelectronic assembly that includes a channel formed in a die attach region of the printed circuit board to improve the flow of filled polymeric material into the gap.

BACKGROUND OF THE INVENTION

It is known to directly attach solder bumps on integrated circuit die to bond pads on printed circuit boards to form solder bump interconnections. A gap is formed between the integrated circuit die and the printed circuit board in areas that are not covered by solder bump interconnections. Solder bump interconnections, however, are brittle and can fracture in use. In order to strengthen the solder joints without affecting the electrical connection, the gap is filled with an encapsulant material, which is typically formed of a filled polymer.

One common method of underfilling integrated circuit dies utilizes encapsulant materials to increase the reliability of solder interconnections by dispensing a polymeric precursor on a printed circuit board adjacent to an integrated circuit die. The polymeric precursor is heated to a first temperature and drawn into the gap by capillary action. The precursor is then heated to a second temperature to cure the precursor to form an encapsulant. This method is an improvement over unfilled assemblies, but has limitations. One limitation is the difficulty in getting the polymeric precursor, which is typically very viscous, to flow evenly under the integrated circuit die. The uneven flow leads to uneven underfilling of the integrated circuit die, which leads to solder connections that are susceptible to fractures. Wetting agents and flow modifiers have been used to enhance the flow of the precursor. These materials, however, dilute the precursor material and consequently degrade the properties of the subsequent encapsulant.

Therefore, a need exists for an assembly that is effective in reliably underfilling the gap between an integrated circuit die and a printed circuit board. Further, a need exists to underfill an integrated circuit die with an encapsulant not diluted by wetting agents or flow modifiers.

DETAILED DESCRIPTION OF A PREFERRED EMBODIMENT

The present invention provides a microelectronic assembly comprising a printed circuit board including a substrate, which includes a die attach region and first bond pads disposed at the die attach region. The die attach region includes one or more channels extending across the die attach region apart from the first bond pads. An integrated circuit die is mounted onto the printed circuit board and comprises a major face that faces the substrate and is spaced apart therefrom by a gap. The integrated circuit die also comprises second bond pads disposed on the major face in a pattern such that each of the second bond pads registers with a first bond pad. Solder bump interconnections connect the first bond pads to the second bond pads. An encapsulant is disposed by dispensing a filled polymeric precursor to the perimeter of the die attach region and heating at a first temperature to lower the viscosity of the precursor. The precursor is drawn under the die into the gap through capillary action, and the channel enhances the flow of the precursor. The precursor is subsequently cured to form the encapsulant material that surrounds the solder bump interconnections.

Figure 1:
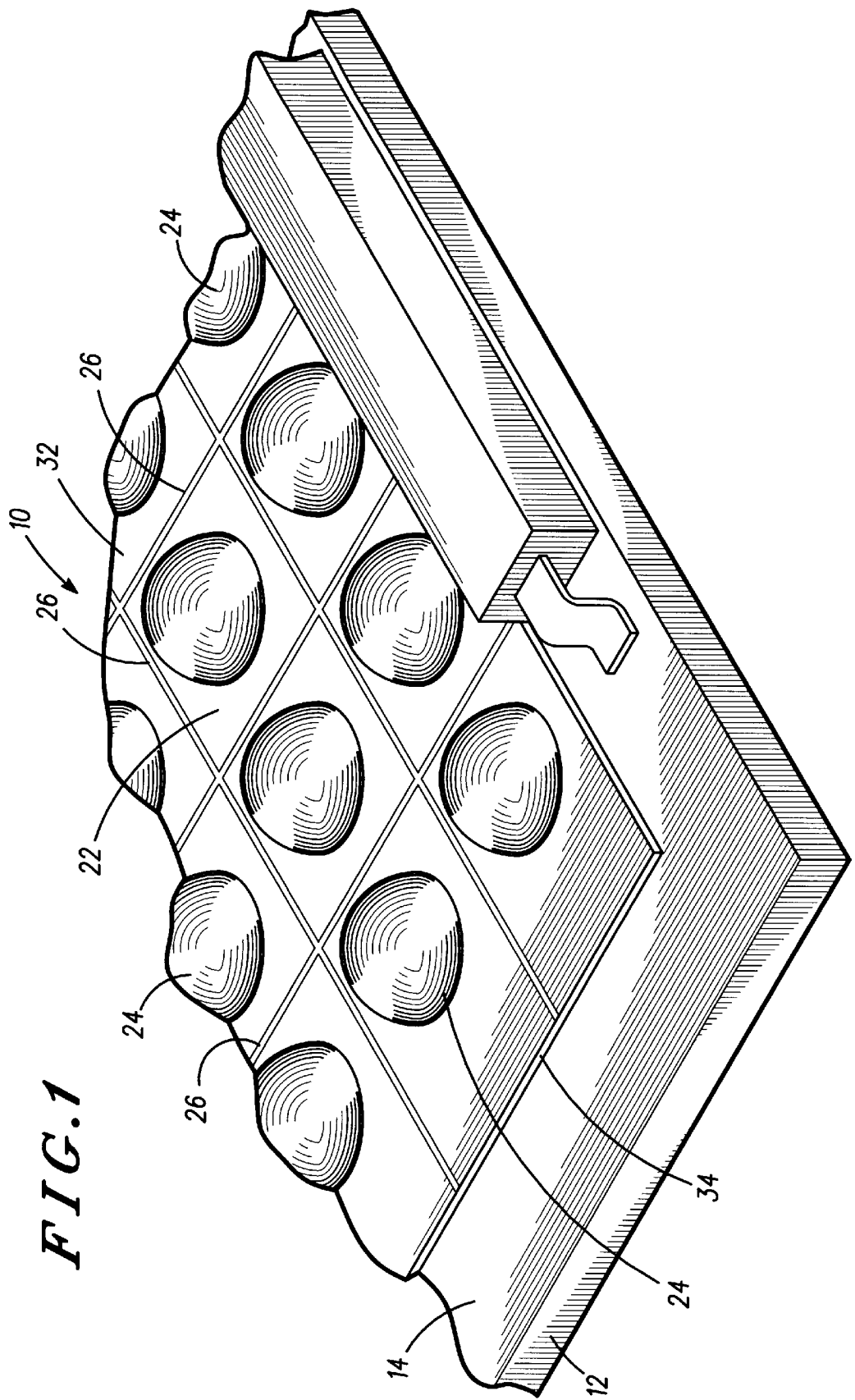
FIG. 1 is a perspective view of a printed circuit board in accordance with a preferred embodiment of the present invention.

The present invention can be further understood with reference to FIGS. 1 through 4. FIG. 1 depicts a printed circuit board 12 that is effective in receiving an integrated circuit die 16 to form microelectronic assembly 10 shown in FIGS. 2 through 4. Printed circuit board 12 comprises a substrate 14 that includes a die attach region 22 having a generally planar surface 32. In a preferred embodiment, die attach region 22 is generally rectangular and has a perimeter 34 that is coextensive with the die to be mounted thereon. Substrate 14 is preferably formed of a polymer layer laminated onto a ceramic or polymer/glass mesh core. First bond pads 24 are disposed about die attach region 22 and are preferably composed of solder-wettable copper that is coated with eutectic tin-lead solder being formed of 63 weight percent tin and the balance substantially lead and having a melting temperature of about 183° C. First bond pads 24 are arranged in a pattern, such as an array having rows and columns, such that first bond pads 24 are spaced apart to form parallel rows.

In a preferred embodiment, die attach region 22 comprises a plurality of channels 26 that extend across die attach region 22. Channels 26 are disposed in a pattern that is effective to increase the fluid flow of a polymeric precursor that is placed onto substrate 14. Channels 26 are preferably linear and extend between and are parallel to the parallel rows of first bond pads 24. In a preferred embodiment, die attach region 22 is rectangular and channels 26 are perpendicular to the sides of die attach region 22. In a preferred embodiment, a series of first linear channels runs perpendicular to a first side of rectangular die attach region 22, and a series of second linear channels runs perpendicular to an adjacent second side of die attach region 22. In this manner, the series of first linear channels intersect the series of second linear channels at right angles. In alternate embodiments, channels 26 run in a single direction, are curved, and are positioned in any pattern that is suitable to enhance the flow of an underfilling encapsulant material. Channels 26 are preferably formed in surface 32 by stamping with a heated metallic stamping tool. Channels 26 can alternately be scribed into the surface of substrate 14, or photolithographically or laser etched into the surface of substrate 14. In a preferred embodiment, channels 16 have a v-shaped cross-section. Alternately, the cross-section of channels 16 is semicircular or rectangular.

Figure 2:
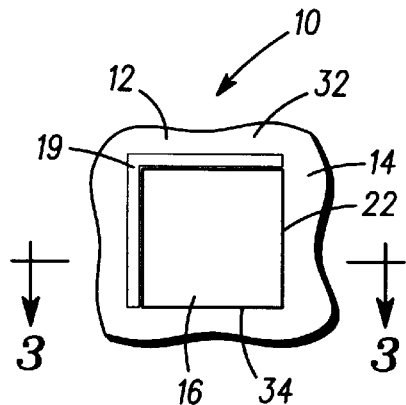
FIG. 2 is a top plan view of a microelectronic assembly prior to encapsulant curing in accordance with a preferred embodiment of the present invention.
Figure 3:
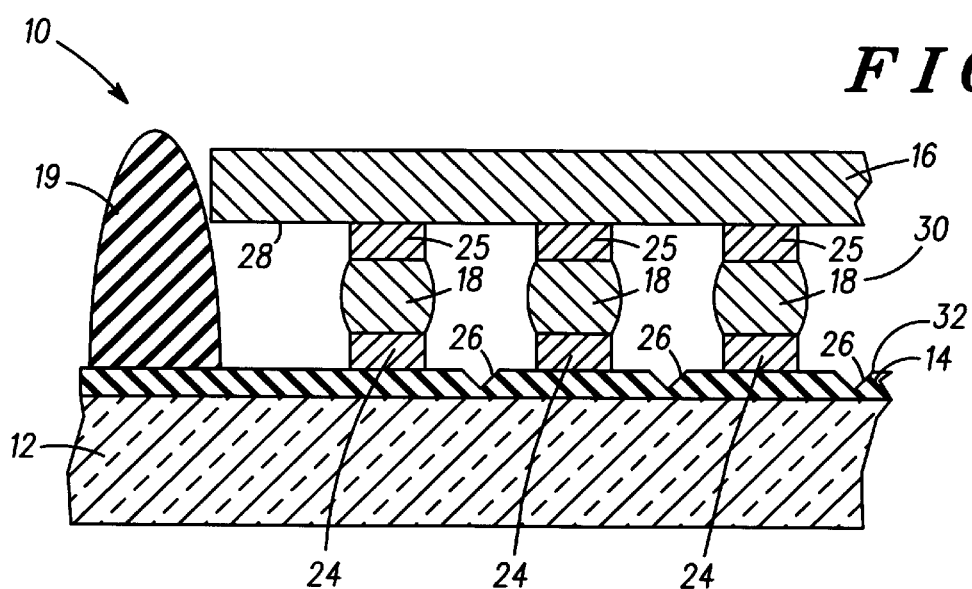
FIG. 3 is a cross-sectional view of the microelectronic assembly in FIG. 2.

FIGS. 2 and 3 show a microelectronic assembly 10 after attachment of integrated circuit die 16 to printed circuit board 12. Second bond pads 25 are preferably disposed on major face 28 of integrated circuit die 16 and are composed of solder-wettable copper that is coated with a tin-lead solder being formed of 97 weight percent lead and the balance substantially tin. A flux is added to first bond pads 24, and integrated circuit die 16 is superposed onto printed circuit board 12 such that each of the first bond pads 24 registers with a second bond pad 25 and major face 28 is substantially parallel to planar die attach region 22. Assembly 10 is reflowed to a temperature sufficient to bond first bond pads 24 to second bond pads 25 to form solder bump interconnections 18. In a preferred embodiment, assembly 10 is reflowed at a temperature above 183° C., and less than 220° C. Gap 30 is formed between major face 28 and substrate 14 upon attachment of integrated circuit die 16 to printed circuit board 12 and is preferably between about 1 and 6 mils.

After printed circuit board 12 and integrated circuit die 16 are reflowed, polymeric precursor 19 is dispensed onto preheated printed circuit board 12. Precursor 19 is dispensed proximate to perimeter 34 of die attach region 22 adjacent to integrated circuit die 16. Precursor 19 is formed of a thermally- or radiation-cured material and is preferably composed of an anhydride-hardened prepolymer material, such as an epoxy resin, utilizing an amine compound catalyst and containing a filler, preferably silica or alumina. Precursor 19 is deposited on two adjacent sides of integrated circuit die 16. Precursor 19 is preferably dispensed onto printed circuit board 12 using a syringe.

Figure 4:
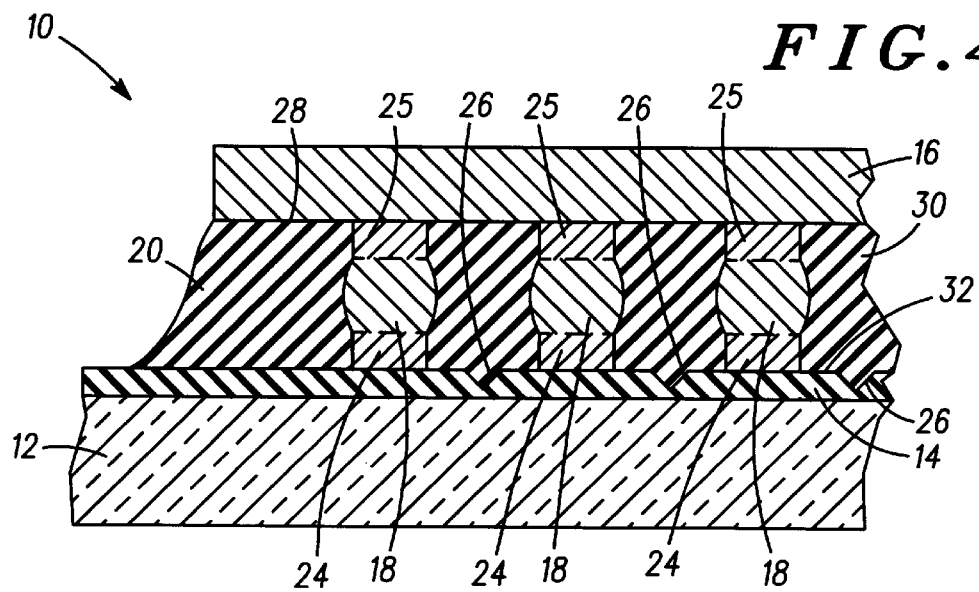
FIG. 4 is a cross-sectional view of the microelectronic assembly in FIG. 2 subsequent to the curing of the encapsulant material.

FIG. 4 shows microelectronic assembly 10 subsequent to the curing of precursor 19 to form encapsulant 20. In a preferred embodiment, assembly 10 is heated to a temperature of about 75° C. prior to the dispensing of precursor 19. This preheating reduces the viscosity and enhances the flowability of precursor 19. Upon heating, precursor 19 flows between integrated circuit die 16 and substrate 14 into gap 30 due to capillary forces, which draw precursor 19 under integrated circuit die 16. The flow of precursor 19 is enhanced by channels 26. Channels 26 facilitate an even distribution of precursor 19 under integrated circuit die 16 and can be configured to spread precursor 19 in a preferred pattern. Upon underfilling integrated circuit die 16, precursor 19 is cured by heating assembly 10 to between about 100° and 175° C. to form encapsulant 20. Encapsulant 20 surrounds solder bump interconnections 18 and improves the reliability of integrated circuit die 16 mounted on printed circuit board 12.

The present invention provides a microelectronic assembly that comprises a substrate having a die attach region and one or more channels defined within the die attach region. Each channel has an end at the perimeter of the die attach region where a prepolymer precursor is dispensed and is drawn into the gap between an integrated circuit die attached to the substrate. Each channel extends away from the perimeter of the die attach region to assist in the fluid flow of the prepolymer precursor. Although not limited to any one particular theory, the channels are effective in increasing the fluid flow by increasing the capillary forces which tend to draw the precursor under the integrated circuit die. The channels allow the precursor to flow more reliably under the integrated circuit die, in order to provide a more reliable underfilling of the integrated circuit die. The channels also provide the ability to provide a preferred fluid flow path under the integrated circuit die to more reliably underfill the integrated circuit die to form a reliable microelectronic assembly.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A microelectronic assembly comprising:
    a printed circuit board comprising a substrate having a die attach region and a plurality of first bond pads disposed at the die attach region in a pattern such that the first bond pads are spaced apart, the die attach region including a channel extending across the die attach region in the substrate and spaced apart from the first bond pads;
    an integrated circuit die mounted onto said printed circuit board and comprising a major face facing the substrate and spaced apart therefrom by a gap, said integrated circuit die further comprising a plurality of second bond pads disposed on the major face such that each second bond pad registers with a first bond pad;
    a plurality of solder bump interconnections, each solder bump interconnection connecting a first bond pad to a second bond pad; and
    an encapsulant disposed within the gap and surrounding said solder bump interconnections.

2. A microelectronic assembly in accordance with claim 1, wherein the first bond pads are arranged in a pattern that includes rows in parallel spaced relationship, and wherein the channel extends between the rows and is parallel thereto.

3. A microelectronic assembly in accordance with claim 2, wherein the die attach region is composed of a polymeric material having a surface that is generally planar, and wherein the channel is formed in the surface.

4. A microelectronic assembly in accordance with claim 3, wherein the die attach region is generally rectangular and comprises a side, and wherein the channel extends perpendicular to the side.

5. A microelectronic assembly comprising:
    a printed circuit board comprising a polymeric substrate having a die attach region that is generally rectangular and a plurality of first bond pads disposed at the die attach region, the die attach region having a generally planar surface and comprising a series of first linear channels defined in the generally planar surface and generally perpendicular to a side of the die attach region;
    an integrated circuit die mounted onto said printed circuit board and comprising a major face facing the polymeric substrate and spaced apart therefrom by a gap, said integrated circuit die further comprising a plurality of second bond pads disposed on the major face in a pattern such that each second bond pad registers with a first bond pad;
    a plurality of solder bump interconnections, each solder bump interconnection connecting a first bond pad to a second bond pad; and
    an encapsulant disposed within the gap and encapsulating said solder bump interconnections, said encapsulant covering the die attach region and the series of first linear channels.

6. A microelectronic assembly in accordance with claim 5, wherein the die attach region further comprises a series of second linear channels intersecting the series of first linear channels.

7. A microelectronic assembly in accordance with claim 5, wherein a cross-section of the first linear channels is v-shaped.

* * * * *